United States Patent [19]

Tingley

[11] Patent Number: 4,870,356
[45] Date of Patent: Sep. 26, 1989

[54] MULTI-COMPONENT TEST FIXTURE

[75] Inventor: Harvey C. Tingley, Bedford, N.H.

[73] Assignee: Digital Equipment Corporation, Maynard, Mass.

[21] Appl. No.: 320,926

[22] Filed: Mar. 8, 1989

Related U.S. Application Data

[63] Continuation of Ser. No. 103,498, Sep. 30, 1987, abandoned.

[51] Int. Cl.$^4$ .............................................. G01R 1/04
[52] U.S. Cl. .............................. 324/158 F; 324/72.5; 324/158 P
[58] Field of Search ............... 324/158 P, 158 F, 72.5; 439/65–67

[56]  References Cited

U.S. PATENT DOCUMENTS

| | | | |
|---|---|---|---|
| 3,568,129 | 3/1971 | Gold et al. | 324/158 F |
| 3,988,648 | 10/1976 | Robinson | 439/66 |
| 4,554,505 | 11/1985 | Zachry | 324/158 F |
| 4,564,251 | 1/1986 | Hansen et al. | 324/158 F |
| 4,574,235 | 3/1986 | Kelly et al. | 324/158 F |
| 4,739,257 | 4/1988 | Jenson et al. | 324/158 F |

FOREIGN PATENT DOCUMENTS

| | | | |
|---|---|---|---|
| 0087451 | 7/1980 | Japan | 324/158 F |
| 0079262 | 6/1981 | Japan | 324/158 F |
| 1521614 | 8/1978 | United Kingdom | 324/158 F |

Primary Examiner—Reinhard J. Eisenzopf
Assistant Examiner—W. Burns
Attorney, Agent, or Firm—Norman P. Soloway

[57] ABSTRACT

A universal test fixture for electrically connecting a plurality of component pins to compute test logic without the need for specialized sockets is described. The test fixture comprises a planar dielectric substrate having a multi-conductor pattern on the top surface comprising a plurality of equal width, spaced conductor bars, and including electrical conductors for connecting the spaced conductor bars to test logic. Also provided is a resiliently deformable member or material for compensating for varying planarity between the tips of the component pins to be tested.

10 Claims, 4 Drawing Sheets

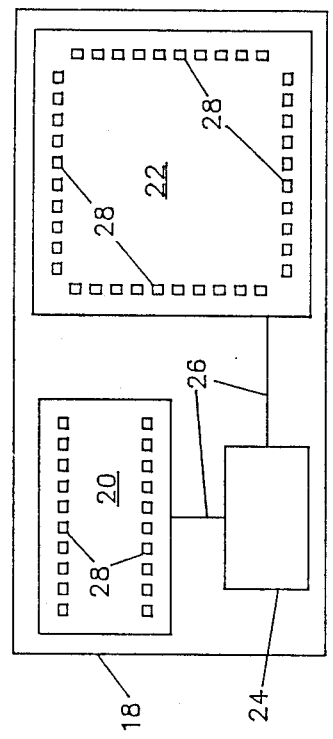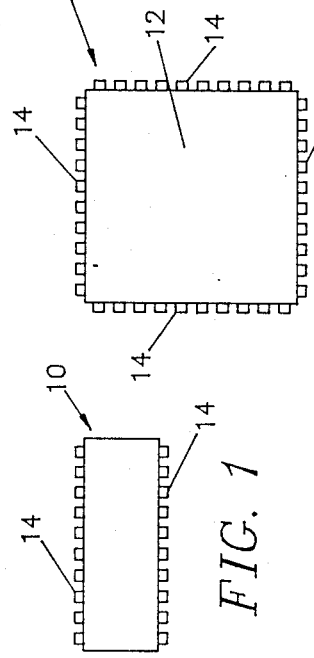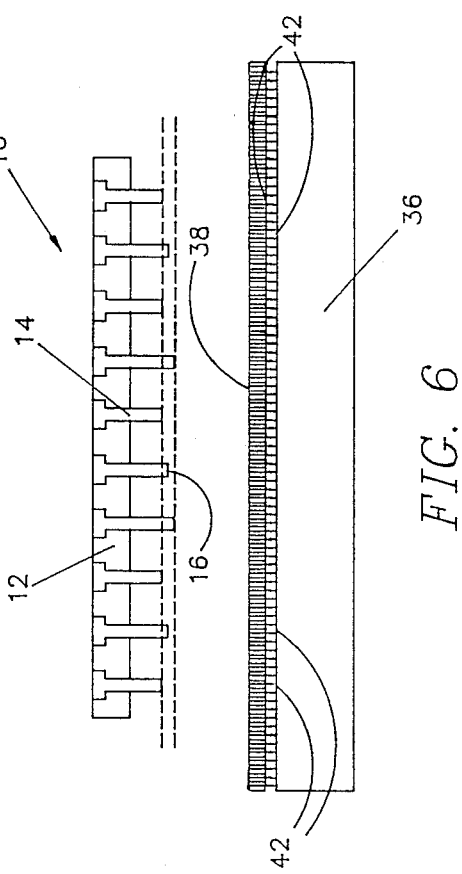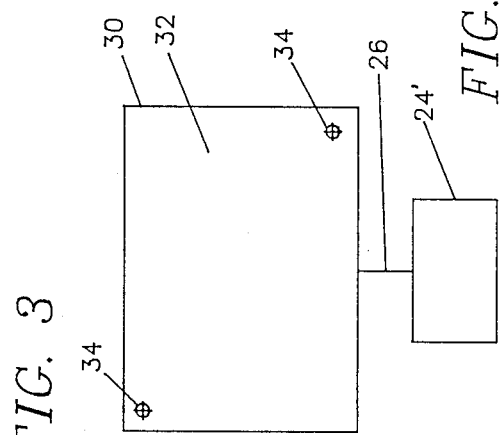

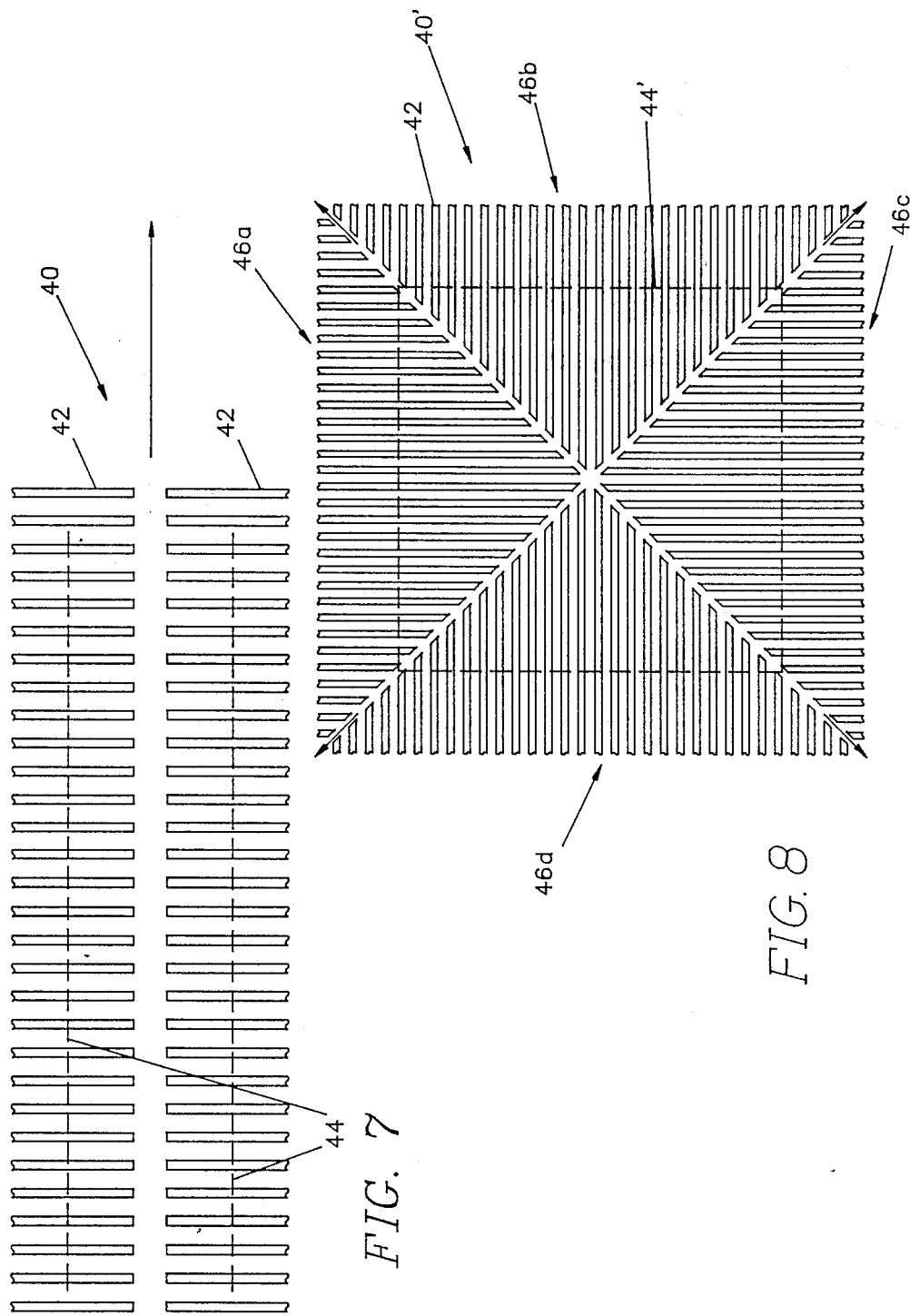

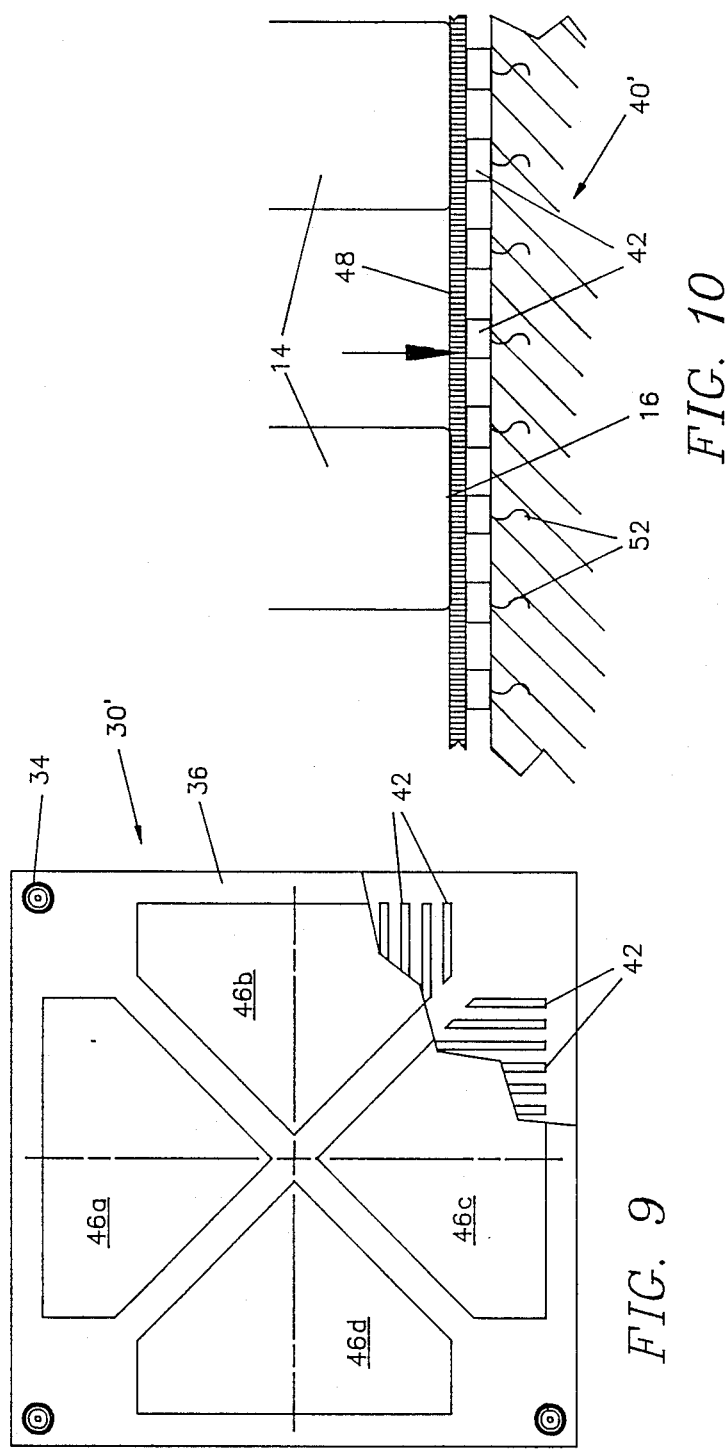

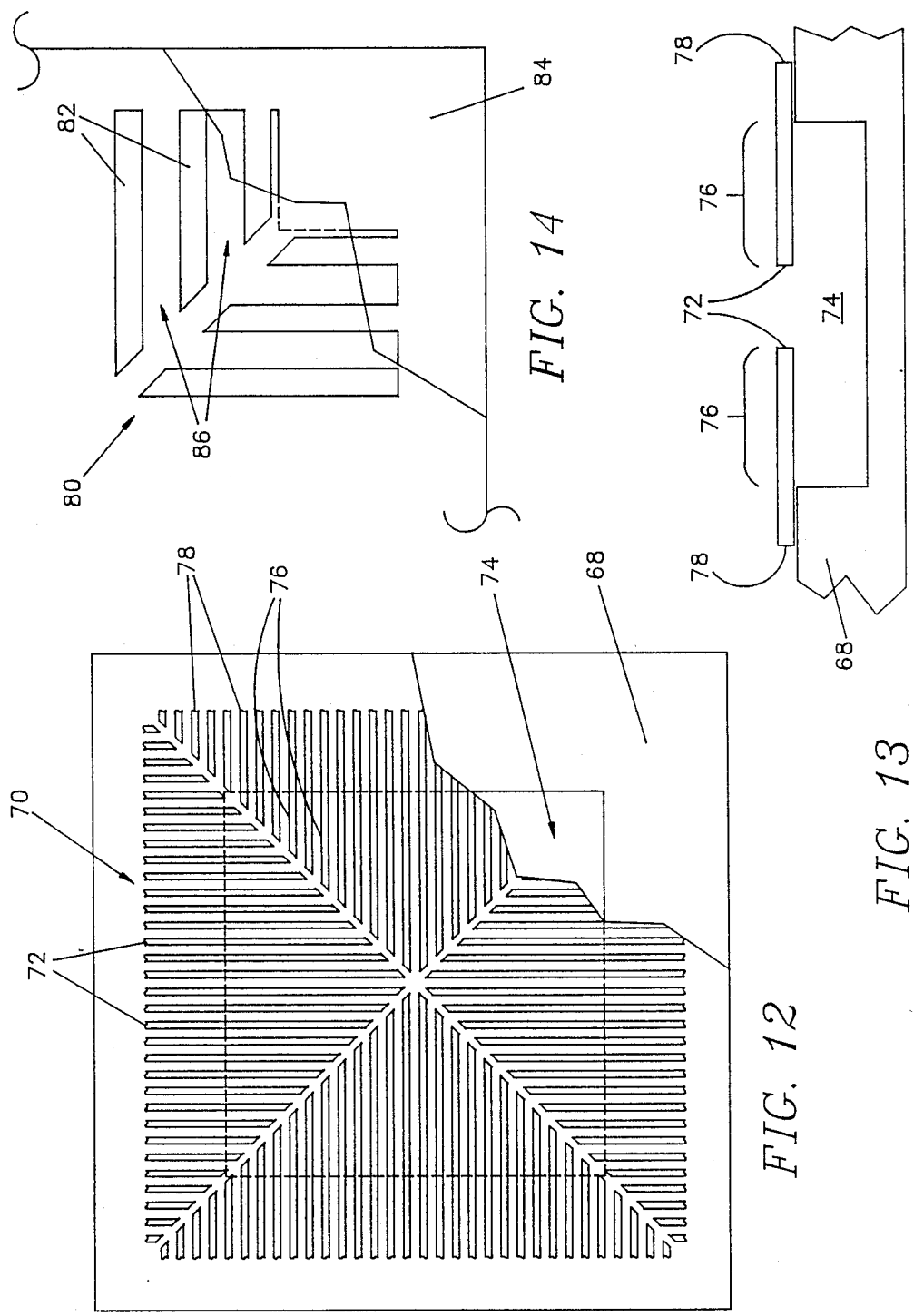

MULTI-COMPONENT TEST FIXTURE

This application is a continuation of my Application No. 103,498, filed Sept. 30, 1987 now abandoned.

BACKGROUND OF THE INVENTION

The present invention relates to testing electronic components, and, more particularly, to a universal test fixture for electrically connecting electronic components to electronic test logic.

Integrated circuit electronic components are rapidly replacing conventional, discrete, long leaded components in electronic instruments such as communications equipments, radio and television, computers and the like. Typically, such integrated circuit components comprise a housing containing an integrated circuit chip, and having a plurality of metallic leads or pins depending downwardly from the housing. Inasmuch as high density circuit board assemblies may comprise a very large number of components, it may prove difficult and time-consuming to identify a defective component. Also, a defective component may damage other components in the assembly. Thus, it is desirable to test components prior to mounting of the components in a circuit assembly. With older components such as discrete long leaded resistors and capacitors, incoming testing generally is simple to perform since such components generally comprise only two leads. Also, once a discrete component has been tested as "good", generally nothing in the manufacturing process short of physically observable destruction, e.g. crushing, or the like, will render the component "bad", i.e. unsuitable for service at its intended operational parameters.

On the other hand, testing of integrated circuits is cumbersome, costly, and time-consuming because of the structure of the components to be tested and the numerous configurations possible. Moreover, integrated circuits can be essentially instantly destroyed by a single discharge of static electricity at any point in the manufacturing process. Thus, the later in the manufacturing process that component testing can be accomplished, the higher the probability that the components in a completed assembly all will be in proper working order. To that end, it would be desirable to test the components as part of component placement and insertion machinery after contact with human operators and their potential for transferring static charges to the components has been eliminated. The problem can be appreciated best with reference to FIGS. 1-3 taken in conjunction with FIG. 4 where FIGS. 1-3 depict the physical structure of the types of components at issue and FIG. 4 depicts the state of the prior art with respect to testing them. Typically, the components 10 comprise a housing 12 containing an integrated circuit chip (not shown) therein. The chip has its leads electrically connected to a plurality of metal leads or pins 14 extending downward from the housing 12. In use, component 10 is electrically and mechanically attached to a circuit board by soldering the leads or pins 14 directly to the circuit board lands and/or board apertures. Alternatively, leads 14 may be inserted into a socket assembly having individual pin receiving slot connectors which in turn are electrically and mechanically attached to the circuit board lands and/or apertures.

As represented by the drawing figures, the typical component 10 is either rectangular or square and has either two parallel rows of leads or pins 14 or four rows of leads or pins 14 as depicted in FIGS. 1 and 2, respectively. Leads or pins 14 depend from opposite sides of the component as shown in FIGS. 1 and 3, terminating in tips 16 lying substantially in a common plane.

In prior art test apparatus such as that generally indicated as 18 in FIG. 4, a plurality of sockets 20, 22 are provided for the varous pin configurations and pin spacings of the components to be tested. Thus, in the apparatus 18 of FIG. 4 there is a socket 20 for receiving components such as that of FIG. 1 and another socket 22 for receiving components such as that of FIG. 2. The sockets 20,22, in turn, are electrically connected to computer based test logic 24 by multi-conductor connectors 26. Respective ones of pin connectors 28 in sockets 20, 22 are connected to respective ones of the plurality of electrical conductors (not shown) within multi-conductors connectors 26 so as to be individually sensible by the test logic 24 in its testing procedure. The construction of the test logic is well known in the art. As can be appreciated, component testing with prior art test fixtures like that of FIG. 4 is inconvenient and requires a plurality of dedicated test fixtures since components with other pin spacings, widths and/or configurations could not be tested in the apparatus of FIG. 4 since they would not fit into the sockets 20, 22.

It is thus an object of the present invention to overcome the aforesaid and other disadvantages of the prior art and to provide a universal test fixture capable of testing various size and shape components having a plurality of pins.

It is another object of the present invention to provide a universal test fixture capable of testing components having pins at various spacings, and configurations.

It is yet a further object of the present invention to provide a test fixture for electronic components which is simple and easy to use, and one which is adapted for automatic in-line testing of components immediately prior to their assembly onto a printed circuit board.

Other objects and benefits of the present invention will become apparent from the detailed description contained hereinafter taken in conjunction with the drawing figures which accompany it.

SUMMARY OF THE INVENTION

In the following detailed description of the invention, the term "component" refers to a so-called chip component or multi-leaded integrated circuit. The term "lead" or "pin" refers to that part of the metal conductor of an electronic component that joins the component circuits to the printed circuit board pattern and may be in the form of a long lead, terminal, lug or the like for direct mechanical and electrical attachment to the circuit board, i.e. by means of solder, or to a lead or pin for physical and electrical attachment to the board by so-called "gas tight" connection via a socket or contact assembly. The term "land" as used herein refers to that part of the metallic pattern on the printed circuit board to which a component or component lead or socket is joined (directly, or via a socket) and may include, if appropriate, a plated-through hole or the like. Unless otherwise designated, the term "component" as used herein is meant to refer to a multi-leaded integrated circuit component or the like. The terms "top surface" and "bottom surface" as used herein with reference to the test fixture arbitrarily denote spacial orientation of the test fixture as illustrated in the drawings. For convenience the top fixture "top surface" shall mean the surface to which the circuit component is brought for testing.

The foregoing objects have been achieved in accordance with the present invention by a test fixture for electrically connecting a plurality of component pins to computer test logic comprising, a substantially planar substrate having a multi-conductor pattern comprising a plurality of spaced conductor bars on the top surface thereof wherein respective ones of the conductors in the pattern are individually connected to the test logic; and means for compensating for varying planarity between the tips of the component pins when the component to be tested is positioned with the tips of the pins in contact with the contact conductor pattern.

In one preferred embodiment of the invention, the multi-conductor pattern is formed from a metal-on-elastomer, resiliently deformable, substantially planar sheet material disposed over a rigid dielectric substrate.

In yet another preferred embodiment of the invention, the multi-conductor pattern is formed from resiliently flexible, elongate spring fingers or beams cantilevered from a rigid dielectric substrate.

For a fuller understanding of the nature and objects of the present invention, reference should be made to the following detailed description taken in connection with the accompanying drawings wherein like numbers depict like parts, and:

DESCRIPTION OF THE DRAWINGS

FIG. 1 is a plan view of a typical electronic component having two rows of pins for which the present invention is useful;

FIG. 2 is a plan view of a typical electronic component having four rows of pins for which the present invention is useful;

FIG. 3 is a side view of the electronic component of FIG. 1;

FIG. 4 is a prior art approach to testing electronic components such as those depicted in FIGS. 1-3;

FIG. 5 is a simplified block diagram of testing apparatus comprising a universal test fixture made in accordance with the present invention;

FIG. 6 is a simplified side elevational view of a test fixture made in accordance with one embodiment of the present invention;

FIG. 7 is a top plan view of a grid pattern as employed in one embodiment of the present invention useful for testing electronic components having a single row or two parallel rows of pins;

FIG. 8 is a top plan view of a grid pattern as employed in another and preferred embodiment of the present invention useful for testing electronic components having a single row, two parallel rows, or four rows of pins in a rectangle.

FIG. 9 is a top plan view, in partial section, of a test fixture made in accordance with a preferred embodiment of the invention;

FIG. 10 is a side elevational view of a portion of the test fixture shown in FIG. 9;

FIG. 11 is a side elevational view, in cross-section, similar to FIG. 10, and showing an alternative construction for the test fixture shown in FIG. 9;

FIG. 12 is a top plan view, in partial section, of a test fixture made in accordance with yet another embodiment of the invention;

FIG. 13 is a side elevational view of a portion of the test fixture shown in FIG. 12; and FIG. 14 is a top plan view, in partial section, of a test fixture made in accordance with yet another embodiment of the invention.

DETAILED DESCRIPTION OF THE INVENTION

The present invention is shown in principle in FIG. 5. As depicted therein, there is a universal test fixture 30 having a universal input grid pattern on the top surface 32 thereof. The universal grid pattern is composed of a plurality of individual conductors as will be described in detail hereinafter which are individually connected by a multi-conductor connector 26 to test logic 24' to be sensible thereby. In the preferred embodiment, alignment indicia 34 are provided on top surface 32 to permit accurate and repeatable placement of components to be tested onto the pattern following initial calibration of logic 24' to the inputs for each component at its designated testing position.

Ideally, the tips 16 of all the pins 14 of the components 10 to be tested lie in the same plane. However, in practice, due to manufacturing tolerances, bending during handling, and the like, this generally is not the case. In the case of prior art dedicated fixturing coplanarity typically is ensured by providing the dedicated fixture with spring biased contact members. As will be appreciated compensating for the differences in length of pins is important where the components are placed in temporary contact with a test fixture since if the shorter pins do not make sufficient contact with the test fixture the test may not be reliable. A feature and advantage of the present invention is to compensate for differences in lengths of pins and varying planarity of pin tips 16. In accordance with the present invention the universal test fixture 30 is provided means for compensating for varying planarity between the tips of the component pins.

Referring also to FIGS. 6, 7 and 8, test fixture 30 will now be described in greater detail beginning with the grid pattern. The grid pattern, generally indicated as 40 or 40' in the figures, comprises a plurality of spaced conductor bars 42. Spaced conductor bars 42, preferably are of equal width, and are each preferably less than the width of the tips 16 of the component pins 14 to be tested, and are generally parallel to one another. While a single row of pins 14 could be tested by a single plurality of conductor bars 42, most components have either two parallel rows of pins 14 or a rectangular configuration of four rows of pins 14. For testing components having a single row or two parallel rows of pins 14, the grid pattern indicated as 40 in FIG. 7 comprises a first and second plurality of the conductor bars 42 disposed as two rows in parallel, electrically non-contacting relationship, while the grid pattern as indicated as 40' in FIG. 8 and comprising first, second, third and fourth pluralities of conductor bars 42 may be used for testing components having a single row, two parallel rows or a rectangular configuration of four rows of pins.

Digressing momentarily to construction, grid pattern 40 and conductor bars 42 thereof are formed from an electrically conductive material disposed on a conventional circuit board dielectric substrate 36. Grid pattern 40 can be formed on substrate 36 in any of numerous manners well known in the circuit board art. Likewise, the actual choice of materials employed is a matter of personal preference. For example, conductive bars 42 may be formed on a conventional printed circuit board dielectric substrate material 36 by a conventional additive or subtractive process, conductive ink printing, foil stamping, laser trimming or like techniques all of which are well known in the circuit board art.

Turning now to FIG. 8 wherein there is shown a preferred grid pattern of the present invention, generally indicated as 40'. Grid pattern 40' has the advantage of being useful for a single line of pins 14, parallel lines of pins 14, and a rectangular pattern of pins 14. Such a rectangular pattern is depicted by dashed pin lines 44'. The preferred grid pattern 40' of FIG. 8 comprises first, second, third and fourth pluralities of spaced conductor bars 42'. As before, conductor bars 42 preferably are of equal width, and preferably are less than the width of the component pins 14 to be tested. Each plurality of conductor bars 42 is configured as a wedge shaped pattern 46a...d with two conductor bars 42 is each of the wedge shaped patterns 46a...d disposed generally radially at 90° electrically non-contacting orientations to one another, with the conductor bars 42 of the first and third pluralities 46a, 46c running generally parallel to one another and the conductor bars of the second and fourth pluralities 46d, 46d running generally parallel to one another whereby the tips 16 of component pins 14 lying substantially along lines 44' forming a rectangle in a common plane can be electrically contacted with the test fixture. Preferably, but not necessarily, conductor bars 42 will be substantially narrower than the width of the pins 14 to be tested. By way of example each of the four wedge shaped patterns 46a...d may be comprised of 0.010 inch wide conductor bars 42 spaced 0.025 inch apart. The reason for this will become clear from the description following.

As noted supra, the tips of the component pins 14 may not be coplanar. Thus, the test fixture in accordance with the present invention is provided with means for compensating for component pin tip non-coplanarity. One type of means is shown in FIGS. 9 and 10.

Referring to FIGS. 9 and 10, conductor bars 42 are overlaid by a resiliently deformable compliant surface material 38 which covers at least the wedge shaped patterns 46a...d. Compliant surface material 48 comprises a material which is normally dielectric, but which, upon compression, becomes electrically conductive in the direction of compression, i.e. as shown in FIG. 10. Such a material is available from Sp America Inc. of San Jose, California under the trademark "MAF Series Interconnector". The manufacturer describes this material as comprising a low resistance elastomer comprising a low resistance elastomer comprising a silicone rubber planar sheet material embeded with spaced, electrically conductive metal fibers normal to the plane of the sheet. MAF Series Interconnector is available in a variety of sheet thicknesses, and has the advantage that only slight pressure is needed to effect good electrical conductivity between the pin tips and the metallic pattern.

Referring to FIG. 10, the manner in which electrical contact is affected between the pins 14 and the grid pattern 40' in the preferred embodiment of the present invention is shown in simplified form in FIG. 11. As depicted therein, when the pins 14 are pushed onto the material 48 disposed over the bars 42, the tip 16 of each pin 14 compresses the material 48 lying immediately under tips 16 and makes contact with the individual conductive fibers underlying the tips, whereby to form an electrical connection between the component pins 14 and conductor bars 42 which in turn, are electrically connected by the individual conductors 52 included within the multi-conductor connector 26 to the test logic 24'. The logic is pre-calibrated for each component 10 so as to know which conductors 52 will be connected to which pins 14 at test time with the component in its pre-established test position on the fixture 30' as repeatably accomplished through the use of the positioning indicia 34 in a manner well known in the art. Components having different pin configurations, pin widths and spacings, etc., will, of course, contact different sets of conductor bars 42. Thus, both initial calibration and subsequent use in testing for a new component 30 are simply and easily affected with minimal time and cost expenditure. As will be appreciated, since the components are simply pressed onto the compliant surface 38 by mechanical apparatus for testing, such testing can easily and conveniently be positioned to take place immediately before use of the components in the same assembly apparatus, using pick and place machines.

Yet another and preferred embodiment of the invention is shown in FIG. 11. As seen in FIG. 11 the test fixture comprises a rigid circuit board dielectric substrate 60 as before, covered at least in part by a resiliently deformable dielectric material 62 such as silicone rubber foam. A plurality of conductor bars 64 making up the conductive grid pattern as before, and formed from a flexible metal sheet such as nickel, copper or gold plated copper foil is formed over and supported by the resiliently deformable dielectric material 62. Such a material is available from PCK Elastomerics, Inc. of Hatboro, Pennsylvania. As before, the individual conductor bars 64 are electrically connected, through means (not shown) to test logic. The test fixture shown in FIG. 11 also has adequate flexibility to compensate for component pin tip non-coplanarity.

Still another embodiment of the invention is shown in FIGS. 12 and 13. As seen in FIGS. 12 to 13, the test fixture comprises a rigid circuit board substrate 68 carrying a grid pattern 70 having a plurality of conductor bars 72 similar to the grid pattern shown in FIG. 9. However, in the embodiment shown in FIGS. 12 and 13, substrate 68 is provided with a depression or aperture 74 underlying the conductor bars 72, in part, so that a portion 76 of the conductor bars 72 extend over, i.e. are cantilevered over the depression or aperture 74. The other ends 78 of conductor bars 72 are fixedly positioned on substrate 68 by means of a suitable adhesive, and are connected by means (not shown) to the test logic. Conductor bars 72 are formed of a thin, resiliently flexible spring metal material such as 20 to 60 mil berillium copper or the like. However, other electrically conductive, resiliently flexible (spring) metals may be employed. Deflection and beam movement may be adjusted by selection of spring material and thickness. The cantilevered conductor bars 72 have adequate flexibility and movement to compensate for variations in coplanarity of the component pin tips.

Various changes may be made in the foregoing without departing from the spirit and scope of the present invention. For example, as seen in FIG. 14, the test fixture may comprise the metal foil grid pattern 80 having a plurality of conductor bars 82 similar to the grid pattern down in FIG. 12. However, in the embodiment shown in FIG. 14, the substrate 84, which is formed of a resiliently flexible dielectric material, is sliced, in part, between adjacent conductor bars 82, i.e. at 86. This produces a resilient flexible cantilevered beam which provides the desired compensation for variations in coplanarity of the component pin tips. Deflection rates and beam movement may be adjusted by selection of substrate material and thickness. As before the individual conductor bars 82 will be electrically converted, through means (not shown) to test logic.

A feature and advantage of the universal test fixture of the present invention is that the test fixture may be used with components having various geometrical configurations, various pin numbers, pin sizes and pin spacings. This results from a combination of grid geometry and the use of conductor bars having individual widths narrower than the width of the pins of the components to be tested. However, if all components to be tested are of the same approximate pin size and spacings, it is possible to use conductor bars of individual width appropriately equal to the width of the component pins, and having spacings between the individual conductor bars substantially equal to the spacings between the individual pins of the components to be tested, i.e. so that the "pitch" of the conductor bars and the component pins match. Still other changes are possible.

Wherefore, having thus described my invention, I claim:

1. An universal test fixture capable of testing components of different sizes having pins at various spacings and configurations by electrically connecting a plurality of component pins to test logic, comprising:
   (a) a substantially planar dielectric substrate having a multi-conductor pattern on the top surface thereof, said pattern defining a test area and comprising a plurality of spaced conductor bars having widths and spacings substantially less than the width and spacings of the component pins to be tested said conductor bars spanning a substantial portion of the test area;
   (b) positioning indicia means for repeatedly positioning a component over said pattern at a pre-established position;
   (c) means for connecting said spaced conductor bars to test logic which is precalibrated for each different component to be tested in accordance with its pre-established test position and the conductors contacted by the component leads; and
   (d) means for compensating for varying planarity between the tips of component pins.

2. A test fixture according to claim 1, wherein the means for compensating for varying planarity between the tips of component pins comprises a resiliently deformable material disposed over said pattern at least in part and in contact therewith, said deformable material being selectively electrically conductive upon compression.

3. A test fixture according to claim 1, wherein the compensating means comprises a resiliently flexible dielectric material underlying said multi-conductor pattern 4. A test fixture according to claim 1, wherein said pattern comprises a plurality of spaced cantilevered conductor bars, said cantilevered bars having adequate movement and deflection to compensate for varying planarity between the tips of component pins.

5. A test fixture according to claim 2, wherein:
   said multi-conductor pattern comprises first, second, third and fourth pluralities of said equal width, spaced conductor bars, said first, second, third and fourth pluralities each being configured as wedge shaped patterns disposed radially at 90° non-contacting orientations to one another with said conductor bars of said first and third pluralities parallel to one another and said conductor bars of said second and fourth pluralities parallel to one another whereby the tips of component pins lying substantially along lines forming a rectangle in a common plane can be electrically contacted with the test fixture.

6. A test fixture according to claim 2, wherein said resiliently deformable material comprises a metal-filled elastomer.

7. A test fixture according to claim 4, wherein said multi-conductor pattern is formed of a resiliently flexible spring metal and wherein said dielectric substrate is undercut in part under portions of said conductor bars.

8. A test fixture according to claim 4, wherein said dielectric substrate is sliced in part between adjacent conductor bars.

9. A test fixture according to claim 1, wherein:
   said multi-conductor pattern comprises a first plurality of said equal width, spaced conductor bars and a second plurality of said equal width, spaced conductor bars disposed side-by-side in non-contacting relationship whereby the tips of component pins lying substantially along two parallel lines in a common plane can be electrically contacted with the test fixture.

10. A test fixture according to claim 1, wherein:
    said multi-conductor pattern comprises first, second, third and fourth pluralities of said equal width, spaced conductor bars, said first, second, third and fourth pluralities each being configured as wedge shaped patterns disposed radially at 90° non-contacting orientations to one another with said conductor bars of said first and third pluralities parallel to one another and said conductor bars of said second and fourth pluralities parallel to one another whereby the tips of component pins lying substantially along lines forming a rectangle in a common plane can be electrically contacted with the test fixture.

* * * * *